(12) United States Patent
Vonlanthen et al.

(10) Patent No.: US 10,545,206 B2
(45) Date of Patent: Jan. 28, 2020

(54) SUPERCONDUCTIVE MAGNET COIL ASSEMBLY COMPRISING A PLURALITY OF LAYER-WOUND STRIP-LIKE SUPERCONDUCTORS

(71) Applicant: Bruker BioSpin AG, Faellanden (CH)

(72) Inventors: Patrik Vonlanthen, Schwerzenbach (CH); Robert Herzog, Zurich (CH); Robert Schauwecker, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 97 days.

(21) Appl. No.: 15/971,611

(22) Filed: May 4, 2018

(65) Prior Publication Data

US 2018/0321343 A1 Nov. 8, 2018

(30) Foreign Application Priority Data

May 5, 2017 (DE) .......................... 10 2017 207 618

(51) Int. Cl.
*H01F 6/06* (2006.01)
*G01R 33/3815* (2006.01)
(Continued)

(52) U.S. Cl.
CPC ....... *G01R 33/3815* (2013.01); *G01R 33/385* (2013.01); *G01R 33/44* (2013.01); *H01F 6/06* (2013.01); *H01F 41/048* (2013.01)

(58) Field of Classification Search
CPC .......................... H01F 6/00; H01F 6/06–6/065
See application file for complete search history.

(56) References Cited

U.S. PATENT DOCUMENTS

| 6,774,752 B2 | 7/2004 | Schlenga et al. |
| 7,330,092 B2 | 2/2008 | Niemann et al. |

(Continued)

FOREIGN PATENT DOCUMENTS

| DE | 10202372 B4 | 8/2003 |
| DE | 102004043987 B3 | 5/2006 |

(Continued)

OTHER PUBLICATIONS

Pitel, J. et al., "Influence of external magnetic fields on critical currents of solenoids wound with anisotropic HTS tapes—theoretical analysis", Superconductor Science Technology 10, 1997, 12 pages.

*Primary Examiner* — Ramon M Barrera
(74) *Attorney, Agent, or Firm* — Edell, Shapiro & Finnan, LLC (57) ABSTRACT

A superconductive magnet coil assembly includes a layer-wound coil that is cylindrically symmetric, wherein the rectangular coil cross section of the coil has a first rectangular portion (1; 1'; 1"; 1"') within the coil cross section, and at least one second rectangular portion (2; 2'; 2"; 2"') and third rectangular portion (3; 3'; 3"; 3"') within the first portion which spans the first portion completely in the radial direction and in part in the axial direction, the second portion being completely wound with the first strip-like superconductor, and the third portion being completely wound with the second strip-like superconductor, and the strip-like superconductors being guided into a region outside the coil cross section and being electrically connected there, and wherein the second and the third rectangular portions are disjunct.

20 Claims, 4 Drawing Sheets

(51) Int. Cl.
*H01F 41/04* (2006.01)
*G01R 33/385* (2006.01)
*G01R 33/44* (2006.01)

(56) References Cited

U.S. PATENT DOCUMENTS

| | | |
|---|---|---|
| 9,117,578 B2 | 7/2015 | Hahn et al. |
| 2006/0152315 A1 | 6/2006 | Schlenga et al. |
| 2013/0065767 A1 | 3/2013 | Schauwecker et al. |
| 2016/0216348 A1 | 7/2016 | Roth et al. |

FOREIGN PATENT DOCUMENTS

| | | |
|---|---|---|
| DE | 102004043989 B3 | 5/2006 |
| DE | 102011082652 A1 | 4/2013 |
| EP | 2906961 B1 | 8/2015 |
| JP | H0655225 U | 7/1994 |
| WO | 9520228 A1 | 7/1995 |

SUPERCONDUCTIVE MAGNET COIL ASSEMBLY COMPRISING A PLURALITY OF LAYER-WOUND STRIP-LIKE SUPERCONDUCTORS

CROSS REFERENCE TO RELATED APPLICATIONS

This application claims foreign priority under 35 U.S.C. § 119(a)-(d) to German Application No. 10 2017 207 618.6 filed on May 5, 2017, the entire contents of which are hereby incorporated into the present application by reference.

FIELD OF THE INVENTION

Aspects of the invention relate to a superconductive magnet coil assembly comprising a layer-wound coil that is cylindrically symmetric with respect to an axis of symmetry and is intended for generating an operating magnetic field in a working volume around the axis of symmetry.

BACKGROUND

Superconducting magnet coils allow extremely energy-efficient generation of strong and temporally constant magnetic fields, since said coils can be operated entirely without, or at least with very small, ohmic losses. The electrical current-carrying capacity of a superconductor is specified by its critical current $I_c$. If the electrical current in the conductor exceeds the value of $I_c$, a phase transition to a normally conducting state occurs, in which state the current no longer flows without resistance.

In an isotropic superconductor, the current-carrying capacity depends on the strength of the magnetic field to which said superconductor is exposed, but not on the direction of the magnetic field in a plane perpendicular to the conductor axis. In contrast, in an anisotropic superconductor, the current-carrying capacity is also influenced by the angle of the magnetic field relative to marked directions of the conductor, usually crystallographic directions. This is the case for example in high-temperature superconductors (HTS) such as (Re)BCO or Bi-2223, the underlying crystalline structure of which has a two-dimensional character. The critical current of a strip-like high-temperature superconductor (HTS) is therefore typically lower in a magnetic field perpendicular to the strip plane than in a field in parallel with the strip plane.

In a cylindrically symmetric magnet coil wound from strip-like HTS, this generally leads to the current-carrying capacity of the coil being limited at the axial ends of the winding stack, since the radial components of the magnetic field are greatest here.

In the following, a cylindrically symmetric magnet coil that is layer-wound from an anisotropic superconductor will be considered, the current-carrying capacity of which coil is more strongly suppressed by the field components produced by the coil in the radial direction than by those in the axial direction. "Layer-wound" means that successive windings along the superconductor are wound, mainly in layers, side-by-side along the axis of symmetry, it being possible for each layer to be assigned a constant radius. This is in contrast with so-called pancake coils, in which successive windings are wound over one another mainly radially.

DE 102 02 372 B4 (reference [1]) or U.S. Pat. No. 6,774,752 B2 (reference [2]) disclose solenoid-like coil sections as a solution, which coil sections are characterized in that the radially innermost coil section is wound with a strip-like superconductor, onto a coil support that protrudes, at least at an axial end, in the axial direction beyond the winding stack of the radially adjacent coil section, and in that the strip-like superconductor is guided tangentially outwardly, on this side, into a region of reduced magnetic field strength, and ends in at least one electrical connection point. In addition, the following solutions are disclosed as specific embodiments. In the region having reduced magnetic field strengths, two strip-like superconductors are interconnected and a plurality of strip-like superconductors are wound in one coil section. In addition, groove-like depressions in the surfaces of the bobbin for strip guidance are disclosed, as well as flexible mats and partial shells having depressions for defined guidance of the adjacent winding layers.

A disadvantage of these solutions is that there are no axial regions having different strip-like superconductors.

EP 2 906 961 B1 (reference [3]) discloses the following solution.

Strip-like HTS pieces are interlinked (soldered in series) within the winding stack, each linked strip piece being connected to two further strip pieces in each case, such that the further strip pieces together substantially overlap the overall length of the linked strip piece. FIG. 11 of this document discloses, as an example, a coil section comprising three portions in the axial direction, the edge regions being formed by a single strip and the central region being formed by a double strip.

This solution has multiple disadvantages. The soldering process within the coil is difficult, in particular, very long strip lengths have to be soldered in order to achieve low-ohmic resistance. The soldered connections (joints) are not superconducting. Problems of homogeneity may arise due to the variations in thickness of the strips in the soldered region. It is difficult to apply the electrical insulation at the soldering points in a uniform manner.

DE 10 2004 043 987 B3 (reference [4]) describes how a strip-like superconductor is guided from one sub-chamber into another sub-chamber via a single-layer transfer winding, over the frustoconical lateral surface of the first separating body, a second separating body being provided that extends the first separating body, in the notch region, radially outwardly towards a circular cylinder, the single-layer transfer winding being arranged between the separating bodies. The disadvantage of this solution is that the separating body is intended to define a notch region and therefore covers a large axial region. There are four windings in FIG. 1 of said document.

For coil assemblies that are wound with "double pancakes", the approach using different conductor widths according to U.S. Pat. No. 9,117,578 B2 (reference [5]) can be applied, the wider conductors having higher current-carrying capacity due to being positioned at the edge of the coil. Coil assemblies of this type are poorly suited to NMR applications both due to the too low field stability (large number of soldered connections, and therefore relatively high resistance) and due to the inadequate field homogeneity (current distribution is spatially too uneven).

SUMMARY

Aspects of the invention relate to a superconductive magnet coil assembly comprising a layer-wound coil that is cylindrically symmetric with respect to an axis of symmetry and is intended for generating an operating magnetic field in a working volume around the axis of symmetry, and having a sectional plane that contains the axis of symmetry and intersects the coil, the coil having a rectangular coil cross section in the sectional plane, which cross section is defined by a radially inner and radially outer and a first axial and second axial coil edge defined by the position of a radially innermost winding and a radially outermost winding of the coil that are at the smallest and largest distance, respectively, from the axis of symmetry, and by the position of a first axial and a last axial winding of the coil having the smallest and largest coordinates, respectively, in the direction of the axis of symmetry, the coil comprising at least one first strip-like superconductor and one second strip-like superconductor, the strip-like superconductors having a width-to-height (width to thickness) ratio of >3, and the strip-like superconductors being guided into a region outside the rectangular coil cross section and being electrically connected there.

It is an object of the present invention to modify a superconductive magnet coil assembly of the type discussed above and a method for its production, using relatively simple technology, such that the deficiencies, discussed above, of such known superconductive magnet coil assemblies are prevented, or at least significantly reduced. In particular, a magnet coil assembly is intended to be wound in layers, having a plurality of anisotropic strip-like HTS pieces per coil, in order to generate a particularly homogenous magnetic field using a winding stack that is as homogenous as possible. This is significantly more difficult in the case of the known "double pancakes" that are often wound from strip-like HTS. Since the strength and direction of the magnetic field changes significantly within a magnet coil, in the direction in parallel with the coil axis (z-coordinate), and the current-carrying capacity of the strip-like superconductor is heavily dependent on the magnetic field and in particular on the direction of the magnetic field, it is desirable to wind strip-like superconductors having different current-carrying capacities in axially different regions, depending on the magnetic field strength and on the magnetic field direction (for example, winding wider conductors at the edge of the coil, since large radial fields occur there).

According to a first formulation, the invention addresses this object with readily available technology, by a superconductive magnet coil assembly, which comprises the following features: A first rectangular portion within the rectangular coil cross section which completely spans the coil cross section in the direction of the axis of symmetry, at least one second and third rectangular portion within the first rectangular portion which cover the first rectangular portion completely in the radial direction and in part in the axial direction, the second rectangular portion being completely wound with the first strip-like superconductor, and the third rectangular portion being completely wound with the second strip-like superconductor, and the second and the third rectangular portion being disjunct, the strip-like superconductors having different superconducting current-carrying capacities when the field, the field direction relative to the strip plane, and the temperature, are the same.

A further formulation of the invention relates to an assembly in which a plurality of strip-like superconductors are wound onto a coil former, at least two strip-like superconductors being connected in series in a low-ohmic manner (e.g., by soldering) axially outside the winding stack, and the strip-like superconductors being located within the winding stack and mainly in axially different regions.

Further aspects and advantages of the invention are provided as follows. The current density within the winding stack can be increased (or a smaller amount of strip-like superconductor needs to be wound in order to generate the same field), since different conductors can be used in axially different regions, in accordance with the magnetic field distribution.

The possibility of arranging the electrical connections (joints) in a region having a low magnetic field allows for simpler and/or lower-ohmic or even superconducting joints.

It is easier to obtain a very homogenous winding stack, since joints can be arranged outside the winding stack (in contrast to the soldered connections within the winding stack, according to reference [3]).

Winding the inputs and outputs mainly in the innermost layer makes it possible, by appropriately selecting the conductor geometry or the wire-wrap technique, to ensure that the radial field components are reduced at the edge and that the current-carrying capacity of all the strip-like superconductors thus remains high even when being led out.

In one class of embodiments of the magnet coil assembly according to aspects of the invention, the number of layers in the first rectangular portion is greater than three.

In general, it is advantageous to wind winding stacks having at least three layers, since a very large number of electrical connections are otherwise required.

Specifically, it is advantageous to wind winding stacks having more than three windings per layer, in particular, in order to achieve a magnetic field that is as homogenous as possible.

Embodiments of the invention in which the strip-like superconductors are selected such that their superconducting current-carrying capacity is dependent both on the field amplitude and on the field direction relative to the strip plane are also particularly preferred.

This solution is particularly advantageous for anisotropic superconductors, i.e. for conductors in which the critical current density is heavily influenced by the radial field. Depending on the requirements, different kinds of superconductors can be wound in axially different regions, for example conductors having a high $I_c$ at the axial edges of the coil.

Further advantageous embodiments of the magnet coil assembly according to the invention are characterized in that a difference in the superconducting current-carrying capacity of the strip-like superconductors results from the width and/or the thickness of the superconducting layer and/or the material properties, in particular, the chemical composition of the superconducting layer, being selected so as to be different.

Selecting these properties of the strip-like superconductors makes it possible for its superconducting current-carrying capacity to be adapted precisely to the different requirements in terms of field strength and direction in different portions of the coil.

Embodiments of the coil assembly according to the invention in which the cross section of the first strip-like superconductor differs from the cross section of the second strip-like superconductor are also particularly preferred.

Winding very different conductors can be advantageous for the current load ($I/I_c$), and can contribute to reducing the radial field components at the edge of the coil. Different conductors can also be selected in axially different regions in order to optimize the mechanical load.

Embodiments of the invention are characterized in that the strip-like superconductors are soldered together over a surface area of >1 $cm^2$, preferably >10 $cm^2$, and at a transition resistance of less than $10^{-6}$ ohms, preferably <$10^{-8}$ ohms, or are connected in a superconducting manner at a transition resistance of less than $10^{-8}$ ohms, are also advantageous. The magnet coil can thus be operated in "persistent mode".

Embodiments of the coil assembly according to the invention in which the strip-like superconductors consist of an HTS material, in particular of the type ReBCO (Re="rare earth", e.g., yttrium) have also proven themselves in practice. High-temperature superconductors are the most important anisotropic superconductors for practical applications.

In embodiments of the invention, the magnet coil assembly is an NMR high field magnet, in the center of which a homogenous magnetic field is generated.
The coil assemblies according to aspects of the invention are suitable in particular for NMR applications, because they allow a particularly strong, constant and homogenous magnetic field to be generated.

In a further important class of embodiments of the magnet coil assembly according to aspects of the invention, at least two strip-like superconductors are separated, in a second and a third rectangular portion, by wedges.

Using wedges allows for precise windings and thus very homogenous magnets, as are required for example for high-resolution NMR spectrometers.

Advantageous developments of these embodiments are described in that at least one strip-like superconductor is guided, by a first wedge, from a first layer to a second, radially more inner, layer.

Using a specially shaped wedge is one of the options for winding axially separate winding stacks. Another option is described below.

In particularly advantageous variants of these developments, a second wedge is provided as a counterpart to the first wedge, wherein the second wedge forms a stop for winding a second strip-like superconductor. The second wedge makes it possible to form a clean stop for the second winding stack, in a space-saving manner.

Other developments of the class of preferred embodiments described above are described by wedges having the following parameters:
a) $0 \leq A \leq 4$ mm, in particular $A < 1$ mm, where A is the width of the thin end of the wedge,
b) $B = A + W$, where B is the width of the thick end of the wedge and W is the width of a strip-like superconductor,
c) the wedges extend along a complete winding of the strip-like superconductor at a constant height $\Delta R$. The height $\Delta R$ transitions steadily to 0 at the end of the complete winding, within an angle $\alpha < 180°$, preferably within $\alpha < 60°$. This wedge shape is particularly advantageous because the conductor can be guided from a first layer to a second, radially more inner, layer within a winding.

Finally, further advantageous developments are described in that a plurality of strip-like superconductors are guided over the same wedge.

A method for producing a superconductive magnet coil assembly of the above-described type according to aspects of the invention by winding at least two strip-like superconductors in at least one second and third rectangular portion that may be described by the following steps: (a) winding at least one layer of the first strip-like superconductor in layers in the direction of the axis of symmetry in a second rectangular portion; (b) winding at least two layers of the second strip-like superconductor in layers in the direction of the axis of symmetry in a third rectangular portion, a store containing an amount of the first strip-like superconductor required later co-rotating therewith; and (c) winding at least one further layer of the first strip-like superconductor over the second strip-like superconductor wound in the preceding step, using the strip length of the first strip-like superconductor kept in the store.

A significant advantage of this method is that axially separate winding stacks can thus be wound in a simple manner.

Further advantages of aspects of the invention can be found in the description and the drawings. Likewise, according to the invention, the features mentioned above and set out in the following can each be used individually per se or together in any combinations. The embodiments shown and described are not to be understood as an exhaustive list, but instead are of an exemplary nature for describing the invention.

DESCRIPTION OF THE DRAWINGS

The invention is shown in the drawings and will be described in greater detail with reference to embodiments. In the drawings.

DETAILED DESCRIPTION

Figure 1A:
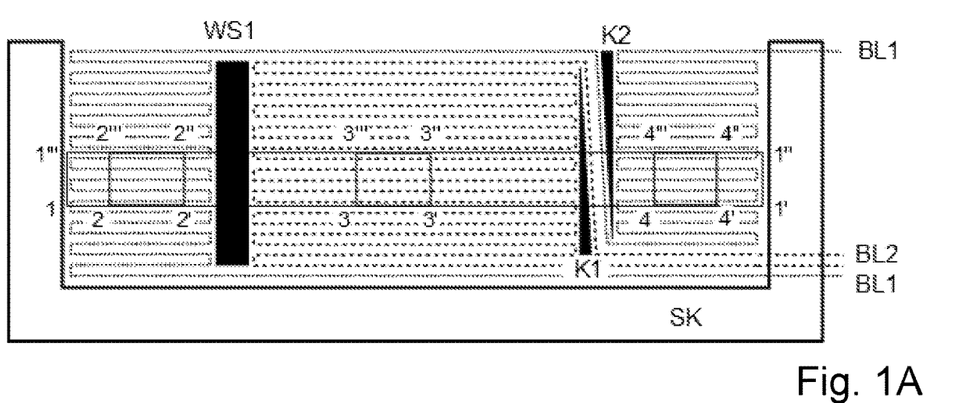
FIG. 1A is a schematic sectional view through a first embodiment of the magnet coil assembly according to an aspect of the invention in a plane containing the axis of symmetry z, showing the relative geometrical arrangement of the four defined rectangular portions of the coil (for reasons of symmetry, only half the coil is shown).

FIGS. 1A-1D schematically show different embodiments of the magnet coil assembly according to aspects of the invention, however, for the sake of clarity the portions explicitly marked with reference signs only are shown in FIG. 1A. The corresponding portions are considered to be analogous to the embodiments in FIGS. 1B-1D and in FIG. 2.

In the winding stack of the coil, the portions of the coil are definable within the rectangular coil cross section, which portions meet the specific requirements according to aspects of the invention, as described as follows. In this case, the rectangular portions are marked by the respective corners of the corresponding portion, which corners are provided with the reference signs 1; 1'; 1"; 1''' or 2; 2'; 2"; 2''' or 3; 3'; 3"; 3''' or 4; 4'; 4"; 4'''. The fourth rectangular portion 4; 4'; 4"; 4''' is located in a different spatial region of the coil from the second rectangular portion 2; 2'; 2"; 2''' that is analogous thereto. The two portions 2; 2'; 2"; 2''' and 4; 4; 4"; 4''' have analogous physical properties.

According to aspects of the present invention, a superconductive magnet coil assembly is provided comprising a layer-wound coil that is cylindrically symmetric with respect to an axis of symmetry z and is intended for generating an operating magnetic field in a working volume around the axis of symmetry z, and having a sectional plane that contains the axis of symmetry z and intersects the coil, the coil having a rectangular coil cross section in the sectional plane, which cross section is defined by a radially inner and radially outer and a first axial and second axial coil edge defined by the position of a radially innermost winding and a radially outermost winding of the coil that are at the smallest and largest distance, respectively, from the axis of symmetry z, and by the position of a first axial and a last axial winding of the coil having the smallest and largest coordinates, respectively, in the direction of the axis of symmetry, the coil comprising at least one first strip-like superconductor BL1 and one second strip-like superconductor BL2, the strip-like superconductors having a width-to-height (width to thickness) ratio of >3, and the strip-like superconductors BL1; BL2 being guided into a region outside the rectangular coil cross section and being electrically connected there.

The magnet coil assembly according to aspects of the invention is preferably an NMR high field magnet, in the center of which a homogeneous magnetic field is generated.

The present assembly according to aspects of the invention differs from other known magnet coil assemblies in that it comprises the following features:
a first rectangular portion 1; 1; 1"; 1''' within the rectangular coil cross section which completely spans the coil cross section the direction of the axis of symmetry,
at least one second and third rectangular portion 2; 2'; 2"; 2''' and 3; 3'; 3"; 3''' within the first rectangular portion 1; 1; 1"; 1''' which cover the first rectangular portion completely in the radial direction and in part in the axial direction, the second rectangular portion 2; 2'; 2"; 2''' being completely wound with the first strip-like superconductor BL1, and the third rectangular portion 3; 3; 3"; 3''' being completely wound with the second strip-like superconductor BL2, and the second and the third rectangular portions 2; 2'; 2"; 2''' and 3; 3'; 3"; 3''' being disjunct.

In this case, the strip-like superconductors BL1; BL2 have different superconducting current-carrying capacities when the (i) field; (ii) the field direction relative to the strip plane; and (3) the temperature are the same with respect to each superconductor.

In the embodiments shown, the number of layers of the first rectangular portion 1; 1'; 1"; 1''' is greater than three and the number of windings per layer in the second and third rectangular portion 2; 2; 2"; 2''' and 3; 3'; 3"; 3''' is also selected so as to be greater than three.

The strip-like superconductors BL1; BL2 are selected such that their superconducting current-carrying capacity is dependent both on the field amplitude and on the field direction relative to the strip plane.

A difference in the superconducting current-carrying capacity of the strip-like superconductors BL1; BL2 can result from the width and/or the thickness of the superconducting layer and/or the material properties of the superconducting layer being selected so as to be different.

The cross section of the first strip-like superconductor BL1 can be selected so as to be different from the cross section of the second strip-like superconductor BL2.

The strip-like superconductors BL1; BL2 generally consist of a high-temperature superconductor (HTS) material, in particular of the type ReBCO (Re="rare earth", e.g., yttrium). Said superconductors are soldered together over a surface area of >1 $cm^2$, preferably >10 $cm^2$, and at a transition resistance of less than $10^{-6}$ ohms, preferably <$10^{-8}$ ohms, or are connected in a superconducting manner at a transition resistance of less than $10^{-8}$ ohms.

In order to allow for a very precise winding, and thus a very homogenous magnet, which is important in particular for NMR magnets, in the embodiments shown in the figures, at least two of the strip-like superconductors BL1; BL2 are separated, in the second and in the third rectangular portions 2; 2'; 2"; 2''' and 3; 3'; 3"; 3''', by a first wedge K1 and a second wedge K2. At least one strip-like superconductor BL1 is guided by a first wedge K1 from a first layer to a second, radially more inner, layer. The second wedge K2 functions as a counterpart to the first wedge K1 and forms a stop for winding a second strip-like superconductor BL2.

As can be seen in FIGS. 1A, 1B, 1C, 1D and 2, a plurality of strip-like superconductors BL1; BL2 can be guided over the same wedge K1.

FIG. 1A shows a particularly advantageous variant of the invention. In this case, a strip-like superconductor BL1 is wound in different regions of the coil cross section (at the edges of the coil as shown here). The strip-like superconductor BL1 wound at the edge preferably has a higher current-carrying capacity (e.g., due to a larger width) than the strip-like superconductor BL2 wound in the middle.

Figure 1B:
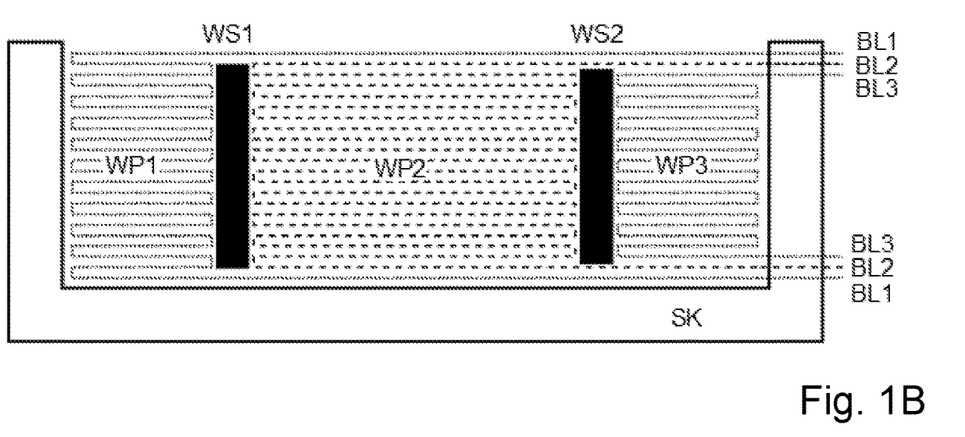
FIGS. 1B-1D are schematic sectional views of further embodiments of the magnet coil assembly according to aspects of the invention.
Figure 1C:
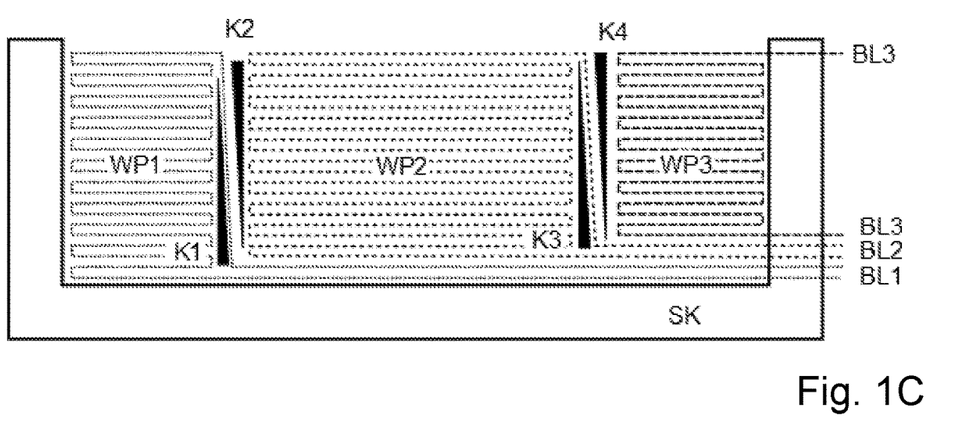

In the assemblies in FIGS. 1A and 1C, it has also been ensured that the strip-like superconductors BL1; BL2; BL3 do not cross and that all inputs and outputs (apart from the output of the last portion) can be led through radially inwardly (in the region of the coil former SK). In this region, the field components normal to the strip plane can be reduced locally using various methods: (a) reducing the winding density; (b) influencing the field using a ferromagnet, e.g., iron (field shaping); and (c) notches in the coil former SK in order to change the orientation of the strip-like superconductor (all conductors entering can be wound over one another, and all conductors leaving can be wound over one another (an insert is required therebetween), in a manner similar to reference [1]). A combination of these methods is also possible.

Figure 5:
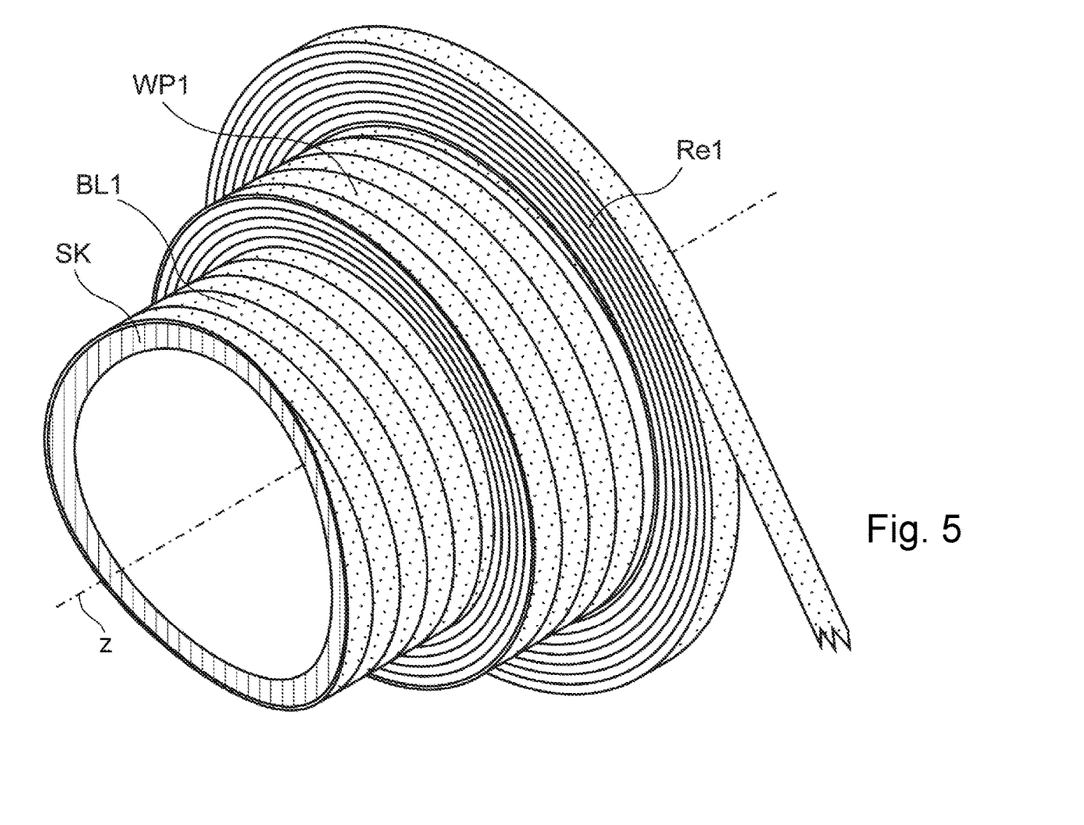
FIG. 5 shows a storage assembly for a temporarily stored length of a strip-like superconductor (BL1).

FIG. 1B shows a variant of the invention. Three strip-like superconductors BL1; BL2; BL3 are wound, and three inputs and three outputs are accordingly required in each case. The connections between the strip-like superconductors BL1; BL2; BL3 outside the coil are not shown here. The wire-wrap technique is layered, but the three strip-like superconductors BL1; BL2; BL3 are located mainly in axially separate regions. During winding, stores Re1; Re2 ("strip stores") that co-rotate with the coil former SK are required, as shown in FIG. 5. Accordingly, this is an application of the method according to aspects of the invention that is characterized by winding at least two strip-like superconductors BL1, BL2 in at least one second and third rectangular portion 2; 2'; 2"; 2''' and 3; 3'; 3"; 3''', characterized by the following steps: (a) winding at least one layer of the first strip-like superconductor BL1 in layers in the direction of the axis of symmetry in a second rectangular portion 2; 2'; 2"; 2"; (b) winding at least two layers of the second strip-like superconductor BL2 in layers in the direction of the axis of symmetry z in a third rectangular portion 3; 3'; 3"; 3''', a store Re1 containing an amount of the first strip-like superconductor BL1 configured to co-rotate therewith; and (c) winding at least one further layer of the first strip-like superconductor BL1 over the second strip-like superconductor BL2 wound in the preceding step, using the strip length of the first strip-like superconductor BL1 in the store Re1.

The embodiment according to FIG. 1B requires the following winding sequence:

a. A layer is wound from the strip input to the opposite end of the winding chamber using a first strip-like superconductor BL1.
b. A plurality of layers of a first winding stack WP1 are wound in a first axially delimited winding region using the first strip-like superconductor BL1. This winding region is delimited on one side by a flange at the end of the winding chamber opposite the strip input, and on the other side by first winding discs WS1 (for example two partial shells). The first winding discs WS1 can be removed after the first winding stack WP1 has been wound.
c. The conductor length required for subsequent winding as far as the strip output out of the winding chamber is wound from the first strip-like superconductor BL1 onto a first store Re1. This first store Re1 co-rotates when further strip-like superconductors BL2; BL3 are wound.
d. A second strip-like superconductor BL2 is wound from the strip input to the end of the first winding region.
e. A plurality of layers of a second winding stack WP2 are wound in a second axially delimited winding region using the second strip-like superconductor BL2. This winding region is delimited on one side by the first winding stack WP1 or by the first winding discs WS1, and on the other side by second winding discs WS2 (for example two partial shells). The second winding discs WS2 can be removed after the second winding stack WP2 has been wound.
f. The conductor length required for subsequent winding as far as the strip output out of the winding chamber is wound from the second strip-like superconductor BL2 onto a second store Re2. This second store Re2 co-rotates when further strip-like superconductors BL3 are wound.
g. A third strip-like superconductor BL3 is wound from the strip input to the end of the second winding region.
h. A plurality of layers of a third winding stack WP3 are wound in a third axially delimited winding region using the third strip-like superconductor BL3. This winding region is delimited on one side by the second winding stack WP2 or by the second winding discs WS2, and on the other side by a flange at the strip input end of the winding chamber.
i. The third strip-like superconductor BL3 is led out of the winding chamber through the strip output.
j. By unwinding from the second and first store Re2; Re1, respectively, the second, and then the first, strip-like superconductors BL2; BL1 are fully wound, up to the strip output, and are guided out of the winding chamber.

If more than three strip-like superconductors are to be wound, steps d, e and f are repeated for each additional strip-like superconductor.

In the winding method according to the invention, stores Re1; Re2 can be wound over a winding stack WP1; WP2 wound onto a coil former SK during the winding method (FIG. 5). Alternatively, storage coils from which the strip-like superconductors BL1; BL2 are unwound, can be co-rotated as stores Re1; Re2 when winding further strip-like superconductors BL2; BL3.

FIG. 1C shows a further variant of the invention. Three strip-like superconductors BL1; BL2; BL3 are wound, and three inputs and three outputs are accordingly required in each case. The connections between the strip-like superconductors BL1; BL2; BL3 outside the coil are not shown. The wire-wrap technique is layered, but the three strip-like superconductors BL1; BL2; BL3 are located mainly in axially separate regions. In this wire-wrap technique, the strip-like superconductors BL1; BL2 are each guided by an assembly of wedges K1; K2 and K3; K4, respectively, close to the winding base (i.e. to the inner radius).

a. A layer is wound from the strip input to the opposite end of the winding chamber using a first strip-like superconductor BL1.
b. A plurality of layers of a first winding stack WP1 are wound in a first axially delimited winding region using the first strip-like superconductor BL1. This winding region is delimited on one side by a flange at the end of the winding chamber opposite the strip input, and on the other side by a first wedge K1.
c. The first strip-like superconductor BL1 is guided to the winding base over the first wedge K1.
d. The first strip-like superconductor BL1 is wound as far as the strip output and is led out of the winding chamber.
e. A second strip-like superconductor BL2 is wound from the strip input to the end of the first winding region. A second wedge K2 is positioned against the first wedge K1, such that a stop for limiting a second winding stack WP2 results, said stop being in a plane perpendicular to the axis of symmetry z of the magnet coil assembly.
f. A plurality of layers of a second winding stack WP2 are wound in a second axially delimited winding region using the second strip-like superconductor BL2. This winding region is delimited on one side by the assembly of the wedges K1; K2, and on the other side by a third wedge K3.
g. The second strip-like superconductor BL2 is guided to the winding base over the third wedge K3.
h. The second strip-like superconductor BL2 is wound as far as the strip output and is led out of the winding chamber.
i. A third strip-like superconductor BL3 is wound from the strip input to the end of the second winding region. A fourth wedge K4 is positioned against the third wedge K3, such that a stop for limiting a third winding stack WP3 results, said stop being in a plane perpendicular to the axis of symmetry z of the magnet coil assembly.
j. A plurality of layers of a third winding stack WP3 are wound in a third axially delimited winding region using the third strip-like superconductor BL3. This winding region is delimited on one side by the assembly of the wedges K3; K4, and on the other side by a flange at the strip input end of the winding chamber.
k. The third strip-like superconductor BL3 is led out of the winding chamber through the strip output.

If more than three strip-like superconductors are to be wound, steps e, f, g and h are repeated for each additional strip-like superconductor.

The winding sequence of the assembly in FIG. 1A is a combination of the two winding sequences described above for the assemblies according to FIGS. 1B and 1C.

Figure 1D:
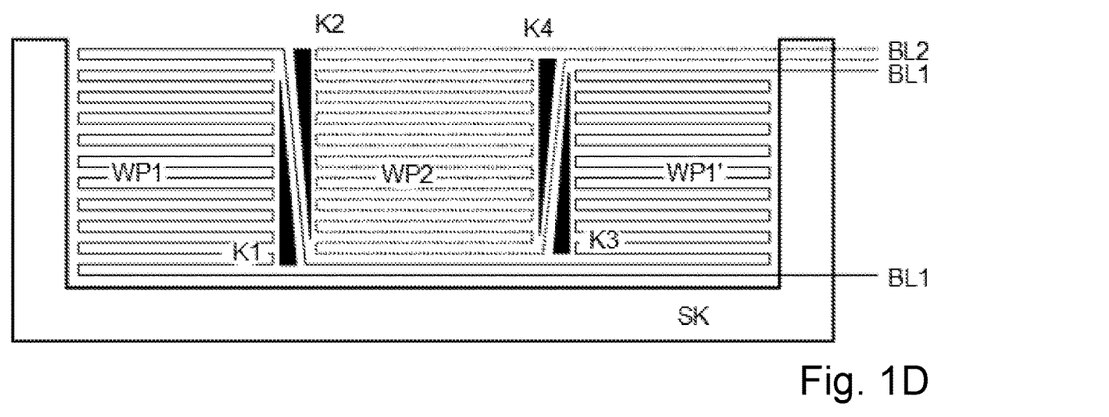

The winding sequence of the assembly according to FIG. 1D, which shows a particularly advantageous variant of the invention, is similar to the winding sequence of the assembly according to FIG. 1C, wherein the two axial edge regions of the coil are wound using the same strip-like superconductor BL1. The strip-like superconductor BL1 wound at the edge preferably has a higher current-carrying capacity (e.g., due to a larger width) than the strip-like superconductor BL2 wound in the middle. In contrast with the variants in FIGS. 1A and 1B, no store Re1; Re2 is required in the variants in FIGS. 1C and 1D because all the strip-like superconductors BL1; BL2; BL3 that are wound in one go from the input to the output.

The method for winding the assembly according to FIG. 1D is as follows:
a. A layer is wound from the strip input to the opposite end of the winding chamber using a first strip-like superconductor BL1.
b. A plurality of layers of a first winding stack WP1 are wound in a first axially delimited winding region using the first strip-like superconductor BL1. This winding region is delimited on one side by a flange at the end of the winding chamber opposite the strip input, and on the other side by a first wedge K1.
c. The first strip-like superconductor BL1 is guided to the winding base over the first wedge K1.
d. The first strip-like superconductor BL1 is wound as far as the flange on the strip output side.
e. A plurality of layers of a further winding stack WP1' are wound in a second axially delimited winding region using the first strip-like superconductor BL1. This winding region is delimited on one side by the flange on the strip input side, and on the other side by a third wedge K3.
f. The first strip-like superconductor BL1 is led out of the winding chamber through the strip output.
g. A second strip-like superconductor BL2 is wound over the winding stack WP1' to the wedge K3 and guided thereover to the winding base.
h. A second wedge K2 is positioned against the first wedge K1 and a fourth wedge K4 is positioned against the third wedge K3, such that a stop for limiting a second winding stack WP2 results on two sides in each case, the two stops each being in a plane perpendicular to the axis of symmetry z of the magnet coil assembly.
i. A second winding stack WP2 is wound between said two stops using the second strip-like superconductor BL2 until the last layer of the second winding stack WP2 is wound over the winding stack WP1' to the output and can be led out of the winding chamber.

Figure 2:
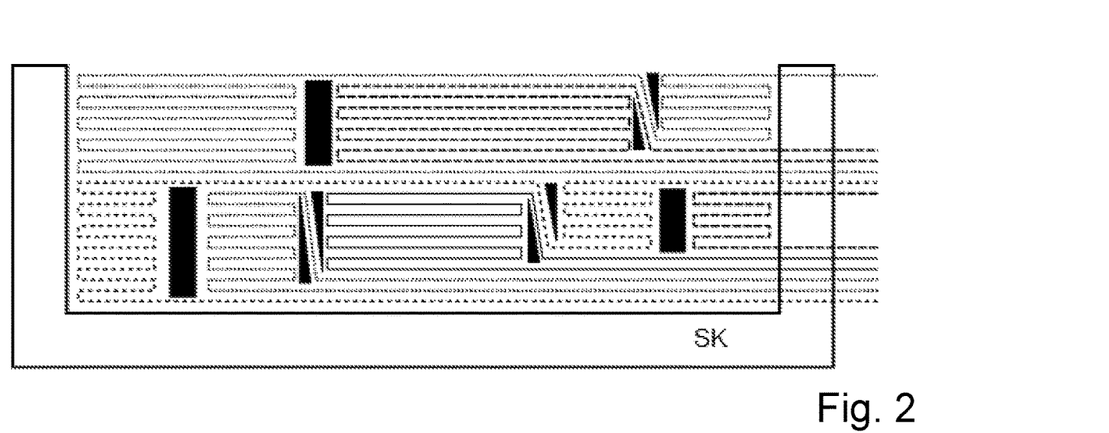
FIG. 2 is a schematic sectional view of an embodiment comprising more than two strip-like superconductors (six conductors in total shown here) in more than three separate winding regions (eight winding regions shown here).

A more complex variant of the invention is shown in FIG. 2. Although less significant in practice, this example shows the general applicability of the invention. The sequence of the winding steps is long but clear to implement. In this variant, just two stores Re1; Re2 need to be positioned, in each case on the far left-hand side, after the radially inner and radially outer region have been wound. These two stores Re1; Re2 never need to be present simultaneously; the second is positioned only after the first has been emptied.

Figure 3A:
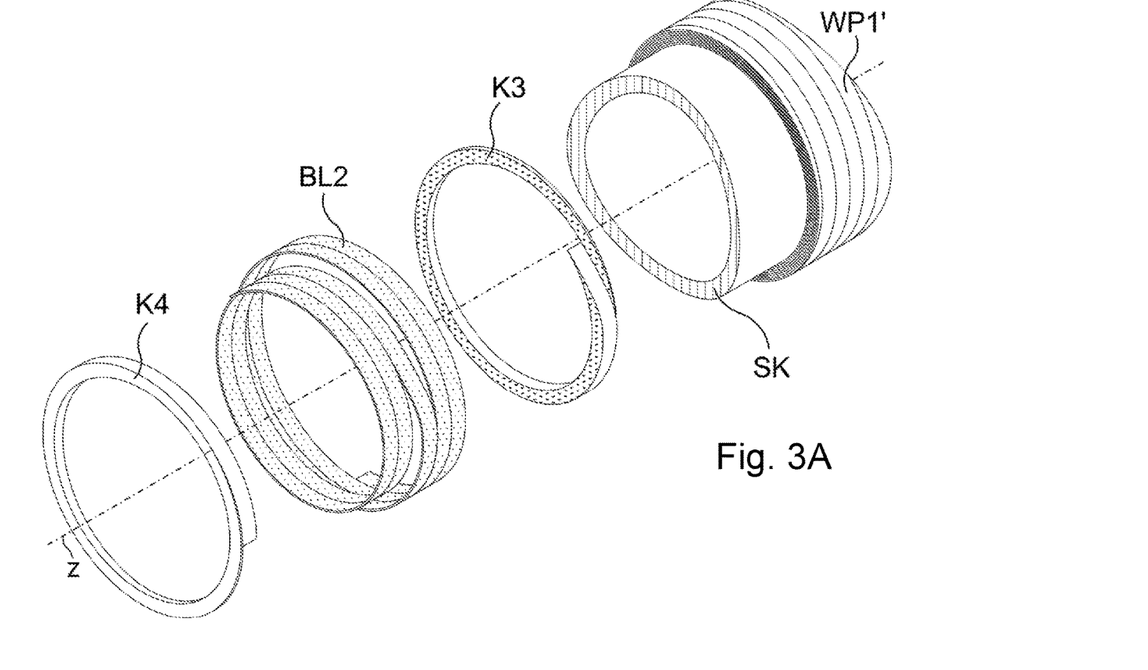
FIGS. 3A-3B are expanded views of a transition of a second strip-like superconductor (BL2) from a larger radius (right-hand side) to a smaller radius (left-hand side), over a third wedge (K3). On the right-hand side, the second strip-like superconductor (BL2) is wound over the winding stack (WP1') from a first strip-like superconductor (BL1) (larger radius), but on the left-hand side it is wound onto a smaller radius, in this case directly onto the coil former (SK). A fourth wedge (K4) covers the transition region and fills the minimum space required for obtaining a rotationally symmetrical winding chamber (left-hand side). The resulting stop is in a plane perpendicular to the axis of symmetry (z).
Figure 3B:
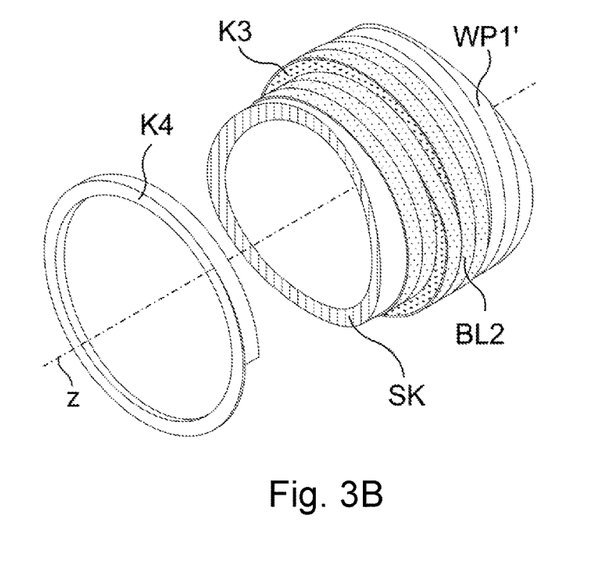
Figure 3C:
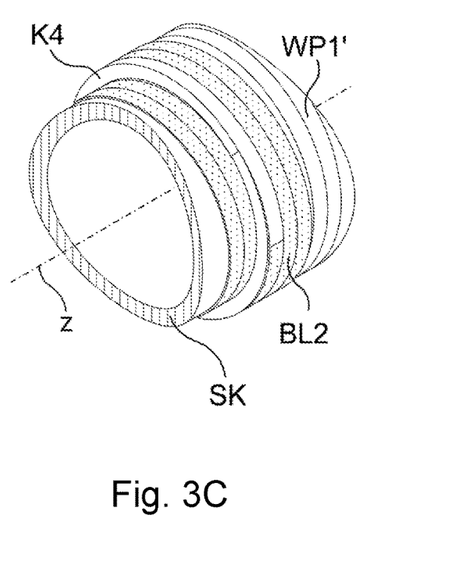
FIG. 3C is a drawing of the transition of the second strip-like superconductor (BL2) when all the components are in the final position.

FIGS. 3A-3C schematically show the wedge assembly comprising the wedges K3; K4 from FIG. 1D. Said wedges are used to guide the second strip-like superconductor BL2 from radially outside into the radially inner region of the coil. At least one layer of the second strip-like superconductor BL2 is wound from the first strip-like superconductor BL1 over an already wound winding stack WP1' and guided over the wedge K3 at the smallest possible axial distance from a smaller winding radius. The fourth wedge K4 is positioned against the third wedge K3 such that a stop for limiting the second winding stack WP2 results, said stop being in a plane perpendicular to the axis of symmetry z of the magnet coil assembly.

Figure 4:
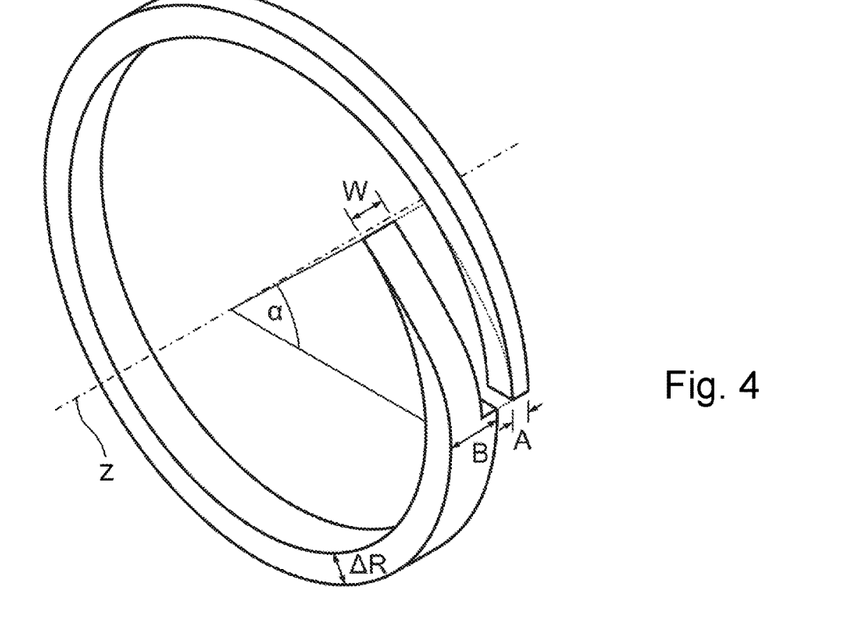
FIG. 4 is a view of the geometric details of a wedge (K1; K2; K3; K4) according to aspects of the invention.

For improved clarity, FIG. 4 shows the two ends of the wedge slightly spread apart. This spreading is closed in the installed state.

This wedge shape is advantageous because the conductor can be guided from one radius to a significantly different radius within a winding.

As shown in FIG. 4, the wedges K1; K2; K3; K4 are characterized by the following parameters:
a) $0 \leq A \leq 4$ mm, in particular $A<1$ mm, where A is the width of the thin end of the wedge,
b) $B=A+W$, where B is the width of the thick end of the wedge and W is the width of a strip-like superconductor BL1; BL2; BL3,
c) the wedges (K1; K2; K3; K4) extend along a complete winding of the strip-like superconductor BL1; BL2; BL3 at a constant height $\Delta R$, and the height $\Delta R$ transitions steadily to 0 at the end of the complete winding, within an angle $\alpha<180°$, preferably within $\alpha<60°$.

A significant advantage of the assembly according to the invention is inter alia that the current-carrying capacity of the strip-like superconductors BL1; BL2; BL3 is adjusted in regions to the field distribution and field orientation within the coil as a whole. As a result, optimal advantage can be taken of the strip-like superconductors BL1; BL2; BL3 used, and the coil can be operated at a higher current. The amount of superconductor required, and thus the material costs, are lower and/or a larger magnetic field can be generated in the center of the coil using the same amount of superconductor.

LIST OF REFERENCE SIGNS

1; 1'; 1"; 1'" first rectangular portion
2; 2'; 2"; 2'" second rectangular portion
3; 3'; 3"; 3'" third rectangular portion
4; 4'; 4"; 4'" fourth rectangular portion (analogous to the second portion)
BL1 first strip-like superconductor
BL2 second strip-like superconductor
BL3 third strip-like superconductor
K1 first wedge
K2 second wedge
K3 third wedge
K4 fourth wedge
$\Delta R$ wedge height
A width of the thin end of the wedge
B width of the thick end of the wedge
W width of the strip-like superconductor
SK coil former
WP1 first winding stack
WP2 second winding stack
WP3 third winding stack
WP1' further winding stack comprising a first strip-like superconductor BL1
WS1 first winding discs
WS2 second winding discs
Re1 first store
Re2 second store
z axis of symmetry of the magnet coil assembly

What is claimed is:
1. A superconductive magnet coil assembly comprising a layer-wound coil that is cylindrically symmetric with respect to an axis of symmetry and is configured for generating an operating magnetic field in a working volume around the axis of symmetry, and having a sectional plane that contains the axis of symmetry and intersects the coil, the coil having a rectangular coil cross section in the sectional plane, which cross section is defined by a radially inner and a radially outer coil edge and a first axial and a second axial coil edge defined by a position of a radially innermost winding and a radially outermost winding of the coil that are at a smallest and a largest distance, respectively, from the axis of symmetry, and by a position of a first axial and a last axial winding of the coil having smallest and largest coordinates, respectively, in the direction of the axis of symmetry, the coil comprising at least one first strip-like superconductor and one second strip-like superconductor, the strip-like superconductors having a width-to-thickness ratio of >3, and the strip-like superconductors being guided into a region outside the rectangular coil cross section and being electrically connected there, wherein a rectangular cross section of the coil comprises:

a first rectangular portion within the rectangular coil cross section which completely spans the coil cross section in the direction of the axis of symmetry, at least one second rectangular portion and at least one third rectangular portion, each within the first rectangular portion which span the first rectangular portion completely in the radial direction and in part in the axial direction, the second rectangular portion being completely wound with the first strip-like superconductor, and the third rectangular portion being completely wound with the second strip-like superconductor, and the second rectangular portion and the third rectangular portion being disjunct, and wherein the strip-like superconductors have different superconducting current-carrying capacities when each of: (i) the field, (ii) the field direction relative to the strip plane, and (iii) the temperature, are the same.

2. The coil assembly according to claim 1, wherein a number of layers in the first rectangular portion is at least three.

3. The coil assembly according to claim 1, wherein a number of windings per layer in the second rectangular portion and the third rectangular portion is greater than 3.

4. The coil assembly according to claim 1, wherein the strip-like superconductors are configured such that the superconducting current-carrying capacity of the strip-like superconductors is dependent both on a field amplitude and on a field direction relative to the strip plane.

5. The coil assembly according to claim 1, wherein a difference in the superconducting current-carrying capacity of the strip-like superconductors results from a width and/or a thickness of a superconducting layer and/or material properties of the superconducting layer being selected so as to be different.

6. The coil assembly according to claim 1, wherein a cross section of the first strip-like superconductor is selected so as to be different from a cross section of the second strip-like superconductor.

7. The coil assembly according to claim 1, wherein the strip-like superconductors are soldered together over a surface area of >1 cm$^2$, and at a transition resistance of less than $10^{-6}$ ohms, or are connected in a superconducting manner at a transition resistance of less than $10^{-8}$ ohms.

8. The coil assembly according to claim 1, wherein the strip-like superconductors comprise a high-temperature superconductor (HTS) material comprising a rare earth metal.

9. The coil assembly according to claim 1, wherein the magnet coil assembly is an NMR high field magnet, in the center of which a homogenous magnetic field is generated.

10. The coil assembly according to claim 1, wherein at least two strip-like superconductors are separated, in a second rectangular portion and a third rectangular portion by wedges.

11. The coil assembly according to claim 10, wherein at least one strip-like superconductor is guided by a first wedge from a first layer to a second, radially more inner, layer.

12. The coil assembly according to claim 11, wherein a second wedge is present as a counterpart to the first wedge and forms a stop for winding the second strip-like superconductor.

13. The coil assembly according to claim 10, wherein the wedges have the following parameters:

a) $0 \leq A \leq 4$ mm, where A is a width of a thin end of the wedge;

b) $B = A + W$, where B is a width of a thick end of the wedge and W is a width of a strip-like superconductor;

c) the wedges extend along a complete winding of the strip-like superconductor at a constant height ($\Delta R$) and the height ($\Delta R$) transitions steadily to 0 at an end of the complete winding, within an angle $\alpha < 180°$.

14. The coil assembly according to claim 10, wherein a plurality of strip-like superconductors are guided over the same wedge.

15. A method for producing a superconductive magnet coil assembly according to claim 1 by winding at least two strip-like superconductors in at least one second rectangular portion and third rectangular portion, wherein the method comprises:

winding at least one layer of the first strip-like superconductor in layers in a direction of an axis of symmetry in a second rectangular portion;

winding at least two layers of the second strip-like superconductor in layers in a direction of an axis of symmetry in a third rectangular portion; a store containing an amount of the first strip-like superconductor configured to co-rotate therewith;

winding at least one further layer of the first strip-like superconductor over the second strip-like superconductor wound in the preceding step, using a strip length of the first strip-like superconductor in the store.

16. The coil assembly according to claim 7, wherein the surface area is >10 cm$^2$, and the transition resistance is less than $10^{-8}$ ohms.

17. The superconductive magnet coil assembly of claim 13, wherein A is less than 1 mm and the angle $\alpha$ is <180°.

18. A superconductive magnet coil assembly comprising a layer-wound coil that is cylindrically symmetric with respect to an axis of symmetry, wherein a rectangular coil cross section of the coil comprises:

a first rectangular portion within the rectangular coil cross section which completely spans the coil cross section radially to the direction of the axis of symmetry, at least one second rectangular portion and third rectangular portion within the first rectangular portion which spans the first rectangular portion completely in the radial direction and in part in the axial direction, the second rectangular portion being completely wound with a first strip-like superconductor, and the third rectangular portion being completely wound with a second strip-like superconductor, wherein the strip-like superconductors are guided into a region outside the rectangular coil cross section and are electrically connected in the outside region; and wherein the second rectangular portion and the third rectangular portion are disjunct.

19. The superconductive magnet coil assembly of claim 18, wherein the strip-like superconductors have different superconducting current-carrying capacities when each of: the field, the field direction relative to a strip plane, and a temperature, are the same.

20. The coil assembly according to claim 18, wherein a number of layers in the first rectangular portion is at least three.

* * * * *